US010873292B2

(12) United States Patent
Niakate

(10) Patent No.: US 10,873,292 B2
(45) Date of Patent: Dec. 22, 2020

(54) RELAXATION OSCILLATORS WITH DELAY COMPENSATION

(71) Applicant: Analog Devices International Unlimited Company, County Limerick (IE)

(72) Inventor: Issa Niakate, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/677,406

(22) Filed: Nov. 7, 2019

(65) Prior Publication Data

US 2020/0186085 A1    Jun. 11, 2020

Related U.S. Application Data

(60) Provisional application No. 62/777,984, filed on Dec. 11, 2018.

(51) Int. Cl.
| | | |
|---|---|---|
| *H03K 3/0231* | (2006.01) | |
| *H03B 5/04* | (2006.01) | |
| *H03L 1/02* | (2006.01) | |
| *H03B 5/24* | (2006.01) | |

(52) U.S. Cl.
CPC ............... *H03B 5/24* (2013.01); *H03B 5/04* (2013.01); *H03K 3/0231* (2013.01); *H03L 1/02* (2013.01)

(58) Field of Classification Search
CPC .......... H03B 5/04; H03B 5/24; H03K 3/0231; H03K 4/50; H03L 1/02
USPC .................................................. 331/111, 143
See application file for complete search history.

(56) References Cited

U.S. PATENT DOCUMENTS

| | | | | |
|---|---|---|---|---|
| 5,670,915 A | * | 9/1997 | Cooper ................ | H03K 3/0231 331/111 |
| 5,859,571 A | * | 1/1999 | Lee ..................... | G11C 11/5628 331/111 |
| 6,326,859 B1 | * | 12/2001 | Goldman .............. | H03K 3/011 331/111 |
| 7,443,254 B2 | | 10/2008 | Gong | |
| 7,847,648 B2 | | 12/2010 | Hu et al. | |
| 7,852,166 B2 | | 12/2010 | Kim | |
| 8,054,141 B2 | | 11/2011 | Saw | |
| 8,373,502 B1 | * | 2/2013 | Chen ................... | H03K 3/0231 327/551 |
| 8,508,306 B2 | | 8/2013 | Choe et al. | |

(Continued)

FOREIGN PATENT DOCUMENTS

| | | |
|---|---|---|
| CN | 102811054 A | 12/2012 |
| CN | 103546123 A | 1/2014 |
| KR | 100742016 B1 | 7/2007 |

*Primary Examiner* — Levi Gannon
(74) *Attorney, Agent, or Firm* — Knobbe, Martens, Olson & Bear, LLP

(57) ABSTRACT

Relaxation oscillators with delay compensation are provided herein. In certain embodiments, a relaxation oscillator includes a capacitor, a current source that outputs a charging current, and control circuitry that operates to selectively charge the capacitor with the charging current. The control circuitry includes a primary or main comparator operable to compare a charging voltage of the capacitor to a threshold voltage. The relaxation oscillator further includes delay compensation circuitry coupled to the capacitor and operable to adjust the threshold voltage to provide compensation for a delay of the control circuitry.

20 Claims, 6 Drawing Sheets

(56) References Cited

U.S. PATENT DOCUMENTS

| | | | |
|---|---|---|---|
| 8,742,858 B2 | 6/2014 | Nonis et al. | |
| 9,048,821 B2 | 6/2015 | Sinitsky et al. | |
| 9,099,994 B2 * | 8/2015 | Thomsen | H03K 3/0231 |
| 10,461,724 B2 | 10/2019 | Hurwitz et al. | |
| 2013/0038364 A1 * | 2/2013 | Tokairin | H03L 7/099 |
| | | | 327/156 |
| 2015/0194949 A1 * | 7/2015 | McQuirk | H03K 5/00006 |
| | | | 327/291 |
| 2015/0249428 A1 * | 9/2015 | Huynh | G11C 16/12 |
| | | | 365/185.18 |
| 2016/0006393 A1 * | 1/2016 | Kim | H03K 3/0231 |
| | | | 331/108 R |
| 2017/0177020 A1 * | 6/2017 | Mukherji | H03B 1/00 |
| 2018/0069531 A1 * | 3/2018 | Wang | H03B 5/24 |
| 2018/0145665 A1 | 5/2018 | Hurwitz | H03K 4/502 |
| 2019/0319611 A1 * | 10/2019 | Sim | H03K 3/02315 |

* cited by examiner

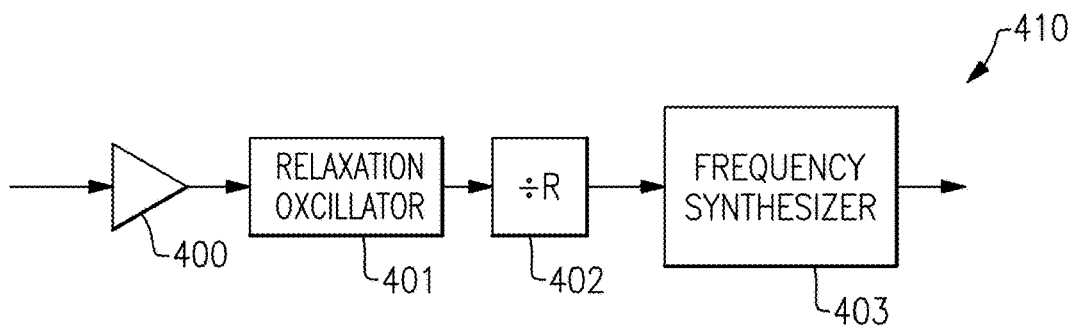
FIG.4A
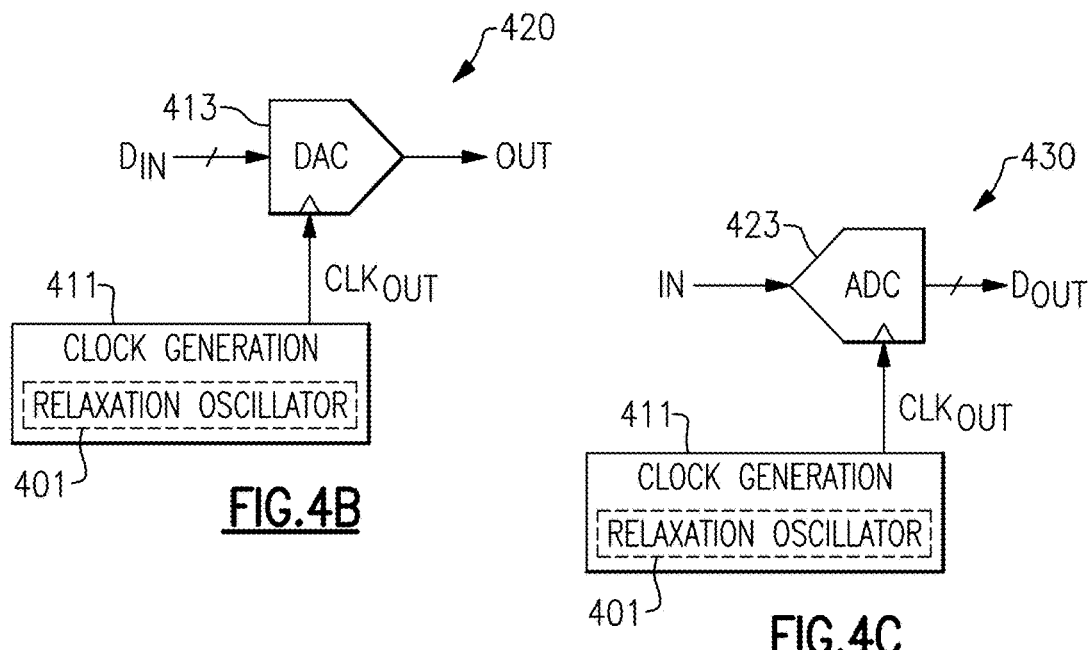
FIG.4B
FIG.4C
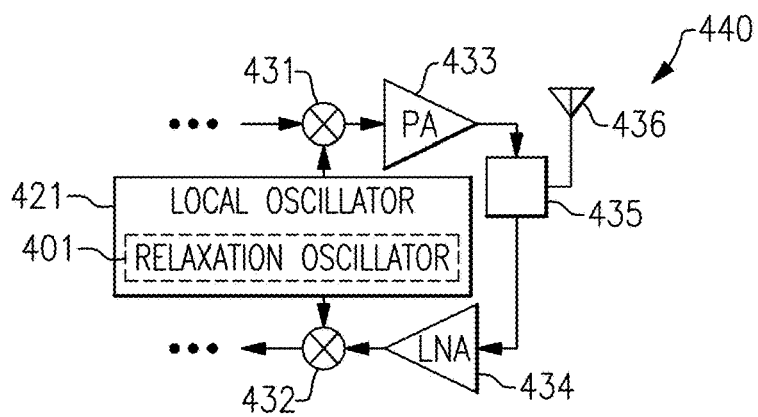
FIG.4D

RELAXATION OSCILLATORS WITH DELAY COMPENSATION

CROSS-REFERENCE TO RELATED APPLICATIONS

The present application claims priority to U.S. Provisional Patent Application No. 62/777,984, filed Dec. 11, 2018, and titled "RELAXATION OSCILLATORS WITH DELAY COMPENSATION," the entirety of which is hereby incorporated herein by reference.

FIELD OF THE DISCLOSURE

Embodiments of the invention relate to electronic systems, and more particularly, to oscillators.

BACKGROUND

A wide variety of electronic systems operate based on timing of clock signals. For instance, examples of electronic circuitry that operate based on clock signal timing include, but are not limited to, analog-to-digital converters, digital-to-analog converters, wireline or optical data communication links, analog front-ends, and/or radio frequency front-ends. An oscillator can be used to generate a periodic signal that can be used as a reference for clock signal generation in such electronic systems.

SUMMARY OF THE DISCLOSURE

Relaxation oscillators with delay compensation are provided herein. In certain embodiments, a relaxation oscillator includes a capacitor, a current source that outputs a charging current, and control circuitry that operates to selectively charge the capacitor with the charging current. The control circuitry includes a primary or main comparator operable to compare a charging voltage of the capacitor to a threshold voltage. The relaxation oscillator further includes delay compensation circuitry coupled to the capacitor and operable to adjust the threshold voltage to provide compensation for a delay of the control circuitry. By implementing the relaxation oscillator in this manner, the relaxation oscillator is compensated for unwanted delay. Absent compensation, variation in the unwanted delay leads to oscillator drift and/or other degradation in the performance characteristics of the relaxation oscillator.

In one aspect, a relaxation oscillator with delay compensation is provided. The relaxation oscillator includes a first capacitor, a first current source configured to output a first charging current, and control circuitry that operates to selectively charge the first capacitor with the first charging current. The control circuitry includes a first primary comparator configured to compare a charging voltage of the first capacitor to a threshold voltage. The relaxation oscillator further includes delay compensation circuitry electrically coupled to the first capacitor and operable to adjust the threshold voltage to provide compensation for a delay of the control circuitry.

In another aspect, a method of delay compensation in a relaxation oscillator is provided. The method includes outputting a charging current from a current source, selectively charging a capacitor with the charging current to control a period of the relaxation oscillator using control circuitry, comparing a charging voltage of the capacitor to a threshold voltage using a primary comparator of the control circuitry, and adjusting the threshold voltage to provide compensation for a delay of the control circuitry In another aspect, a relaxation oscillator with delay compensation is provided. The relaxation oscillator includes a capacitor, a current source configured to output a charging current, and control circuitry that operates to selectively charge the capacitor with the charging current. The control circuitry includes a primary comparator configured to compare a charging voltage of the capacitor to a threshold voltage. The relaxation oscillator further includes means for adjusting the threshold voltage to compensate for a delay of the control circuitry.

BRIEF DESCRIPTION OF THE DRAWINGS

FIG. 4A is a schematic diagram of one embodiment of a frequency synthesis system.

FIG. 4B is a schematic diagram of one embodiment of a digital-to-analog data conversion system.

FIG. 4C is a schematic diagram of one embodiment of an analog-to-digital data conversion system.

FIG. 4D is a schematic diagram of one embodiment of a radio frequency front-end system.

DETAILED DESCRIPTION OF EMBODIMENTS

Figure 1:
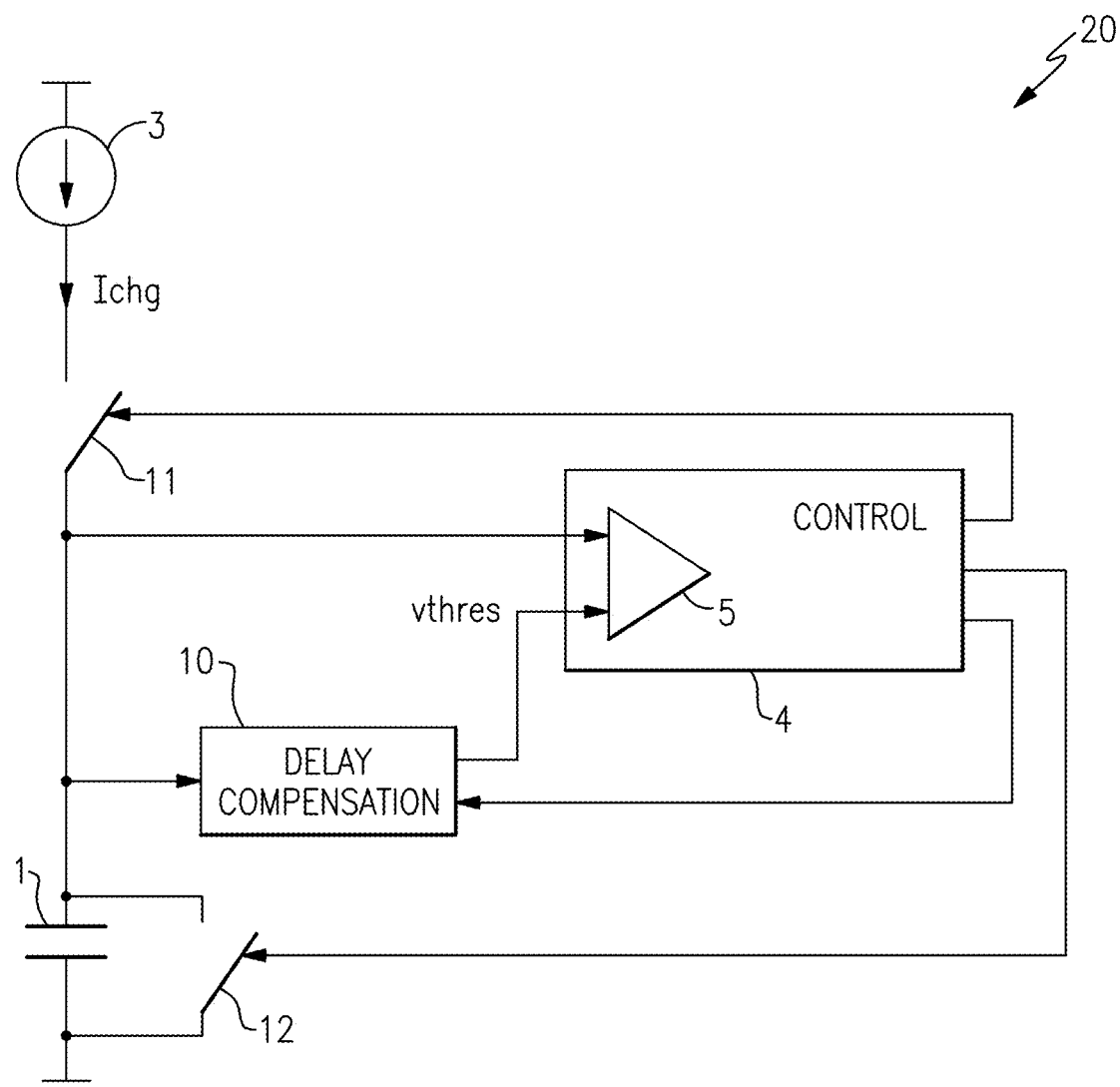
FIG. 1 is a schematic diagram of a relaxation oscillator according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Relaxation oscillators can be used to generate precision clock signals to aid in controlling timing of electronic systems. For instance, a relaxation oscillator can serve to generate a reference clock signal to a frequency synthesizer, such as a phase-locked loop (PLL).

In certain implementations, a relaxation oscillator includes a capacitor that is regularly charged and discharged (also referred to herein as reset) to control a period of the relaxation oscillator. To aid in controlling timing of charging and reset operations of the capacitor, the relaxation oscillator includes control circuitry, such as comparators, latches, digital logic, and/or switches.

When a relaxation oscillator is operating at lower frequencies, the charging time of the capacitor can be about equal to the period of the relaxation oscillator. For example, when operating at low frequency, the charging time of the capacitor can correspond to a relatively large proportion of the relaxation oscillator's period, and thus the delay of the control circuitry can have a negligible impact on the precision of the relaxation oscillator.

However, when operating at higher frequencies, such as 100 MHz or more, the delay of comparators, latches, digital logic, switches, and/or other control circuitry can impact the period of the relaxation oscillator. For instance, as operating frequency increases, the delay of such control circuitry can correspond to an increasing proportion of the period of the relaxation oscillator.

The delay of the control circuitry deteriorates the accuracy of the oscillation frequency of the relaxation oscillator. For instance, comparators, latches, digital logic, switches, and/or other control circuitry can have delay that varies with process, supply voltage, temperature, and/or other operating conditions. The drift in delay arising from such variation can lead to a degradation in performance of the relaxation oscillator.

There is a need for compensating relaxation oscillators for unwanted delay. Moreover, there is a need for delay compensation that is scalable with process node (for instance, scalable with decreasing transistor geometries or process node), that can be integrated with a relaxation oscillator on-chip, and that facilitates the relaxation oscillator in operating at high frequency.

Relaxation oscillators with delay compensation are provided herein. In certain embodiments, a relaxation oscillator includes a capacitor, a current source that outputs a charging current, and control circuitry that operates to selectively charge the capacitor with the charging current. The control circuitry includes a primary or main comparator operable to compare a charging voltage of the capacitor to a threshold voltage. The relaxation oscillator further includes delay compensation circuitry coupled to the capacitor and operable to adjust the voltage level of the threshold voltage to provide compensation for a delay of the control circuitry.

By implementing the relaxation oscillator in this manner, the relaxation oscillator is compensated for unwanted delay. Absent compensation, variation in the unwanted delay leads to oscillator drift and/or other degradation in the performance of the relaxation oscillator.

The teachings herein provide a relaxation oscillator with compensation for unwanted delay. Furthermore, the delay compensation can be implemented with relatively small area and on-chip with the relaxation oscillator. Moreover, the compensation operates with relatively fast start-up time and has high configurability, thereby enhancing flexibility. For example, the duty cycle, compensation at start-up, and/or compensation provided in the steady-state can be controlled (for instance, digitally programmed) for a particular application and/or operating scenario.

In certain implementations, the delay compensation circuitry includes a fully digitized feedback loop (secondary loop) that automatically regulates the threshold voltage of the main comparator(s) of the primary loop such that the effective voltage on the capacitor at the end of the charging cycle is the desired or target voltage corresponding to the desired period of the relaxation oscillator. Thus, the issue of unwanted delay arising from a comparator, latch, switch, and/or other control circuitry is addressed.

Moreover, using feedback provides precision control over compensating the relaxation oscillator for unwanted delay. In contrast, open loop solutions may not be as accurate and/or may be more difficult to tune or trim.

In certain implementations, the delay compensation circuitry includes a copy of the main comparator(s) used to compare the capacitor voltage(s) at the end of the charging cycle to the target voltage. The secondary comparator(s) can include additional switches to operate the delay compensation circuitry in tracking, sampling, and reset phases. The output of the secondary comparator(s) indicates whether the capacitor voltage(s) at the end of the charging cycle is above or below a reference voltage, such as a target feedback voltage. The output of the secondary comparator(s) is processed to provide adjustment to the threshold voltage used by the main comparator(s).

Such delay compensation circuitry provides a flexible solution to calibrating the relaxation oscillator for unwanted delay. For example, the threshold voltage of the primary comparator(s) can be set by a multi-bit digital control signal, and various algorithms can be used to set the control signal's bits. Such algorithms can be selected to reduce convergence time and can vary during start-up or initialization relative to steady-state operation.

Moreover, the delay compensation circuitry need not operate each period of the relaxation oscillator. Rather, the delay compensation circuitry can be operated on a desired number of cycles to provide an appropriate amount of delay compensation for a particular application and/or operating frequency. Thus, the bandwidth and/or duty cycle of the compensation loop can be readily controlled to achieve desired delay compensation characteristics.

FIG. 1 is a schematic diagram of a relaxation oscillator 20 according to one embodiment. The relaxation oscillator 20 includes a capacitor 1, a current source 3, control circuitry 4, delay compensation circuitry 10, a charging control switch 11, and a reset control switch 12. Although one embodiment of a relaxation oscillator is shown in FIG. 1, the teachings herein are applicable to relaxation oscillators implemented in a wide variety of ways.

The control circuitry 4 regularly charges and resets the voltage across the capacitor 1 to control the period of the relaxation oscillator 20. In the illustrated embodiment, the control circuitry 4 selectively charges the capacitor 1 with a charging current (Ichg) generated by the current source 3 based on opening or closing the charging control switch 11. However, other implementations are possible, such as configurations in which the control circuitry 4 selectively enables the current source 3 to control charging of the capacitor 1 with the charging current.

With continuing reference to FIG. 1, the control circuitry 4 also controls discharging or reset of the capacitor 1. In the illustrated embodiment, the control circuitry 4 selectively resets a voltage across the capacitor 1 by opening or closing the reset control switch 12, which is in parallel with the capacitor 1. However, other implementations of discharging the capacitor 1 are possible. For instance, in another example a pair or shunt reset switches are coupled to opposite ends of the capacitor 1.

As shown in FIG. 1, the control circuitry 4 includes a primary comparator 5 that compares a voltage of the capacitor 1 to a threshold voltage (vthres). Additionally, the output of the primary comparator 5 is processed by the control circuitry 4 (for instance, using digital logic, latches, and/or suitable circuitry) to control timing of the switches.

Accordingly, the relaxation oscillator 20 includes the control circuitry 4 for controlling charging and reset operations of the capacitor 1.

Absent compensation, a delay of the control circuitry 4 can impact the performance of the relaxation oscillator 20. For example, when operating at high frequencies, such as 100 MHz or more, the delay of comparators, latches, digital logic, switches, and/or other components of the control circuitry 4 can impact the period of the relaxation oscillator 20.

For example, such circuitry can have delay that varies with process, supply voltage, temperature, and/or other operating conditions, which leads to a drift in the delay and a corresponding uncertainty in the relaxation oscillator's period. Moreover, the impact of such delay increases with frequency, since the delay corresponds to an increasing proportion of the period of the relaxation oscillator.

In the illustrated embodiment, the relaxation oscillator 20 includes the delay compensation circuitry 10, which is operable to adjust a voltage level of the threshold voltage (vthres) of the main comparator 5 so as to compensate a period of the relaxation oscillator 20 for a delay through the control circuitry 4.

In certain implementations, the delay compensation circuitry 10 includes a fully digitized feedback loop (secondary loop) that automatically regulates the threshold voltage of the main comparator 5 such that the effective voltage on the capacitor 1 at the end of the charging cycle is the target voltage. Thus, unwanted delay arising from delay through the control circuitry 4 is addressed.

In certain implementations, the delay compensation circuitry 10 includes a secondary comparator, which can correspond to a copy of the main comparator 5. Additionally, the delay compensation circuitry 10 can include switches for controlling operation of the delay compensation circuitry 10 in tracking, sampling, and reset phases. In certain implementations, the switches are controlled by the control circuitry 4.

The output of the secondary comparator indicates whether the voltage of the capacitor 1 at the end of the charging cycle is above or below the target voltage. The output of the secondary comparator is processed to provide adjustment to the threshold voltage (vthres) used by the main comparator 5.

Such delay compensation circuitry provides a flexible solution to calibrating the relaxation oscillator 20 for unwanted delay. For example, various algorithms can be used to converge the threshold voltage used by the primary comparator 5. For example, such algorithms can be selected to reduce convergence time and can vary during start-up relative to steady-state operation of the relaxation oscillator 20.

Moreover, the delay compensation circuitry 10 need not operate each period of the relaxation oscillator 20. Rather, the delay compensation circuitry 10 can be operated on a desired number of cycles to provide an appropriate amount of delay compensation for a particular application and/or operating frequency. Thus, the bandwidth and/or duty cycle of the delay compensation circuitry 10 can be selected to achieve desired delay compensation characteristics.

In one embodiment, the relaxation oscillator 20 is implemented on a semiconductor die or chip that includes a serial interface or bus that receives digital data for programming at least one delay compensation characteristic of the delay compensation circuitry 10.

The relaxation oscillator 20 can be used in a wide variety of applications. For instance, an output clock signal of the relaxation oscillator 20 can be used as a precision clock signal to aid in controlling timing of an electronic system. For instance, the output clock signal of the relaxation oscillator 20 can serve to as a reference clock for a frequency synthesizer, such as a PLL. Although not depicted in FIG. 1, the output clock signal of the relaxation oscillator 20 can be taken from a wide variety of locations. In one example, a voltage of the capacitor 1 is buffered and/or otherwise processed to generate the output clock signal.

Figure 2A:
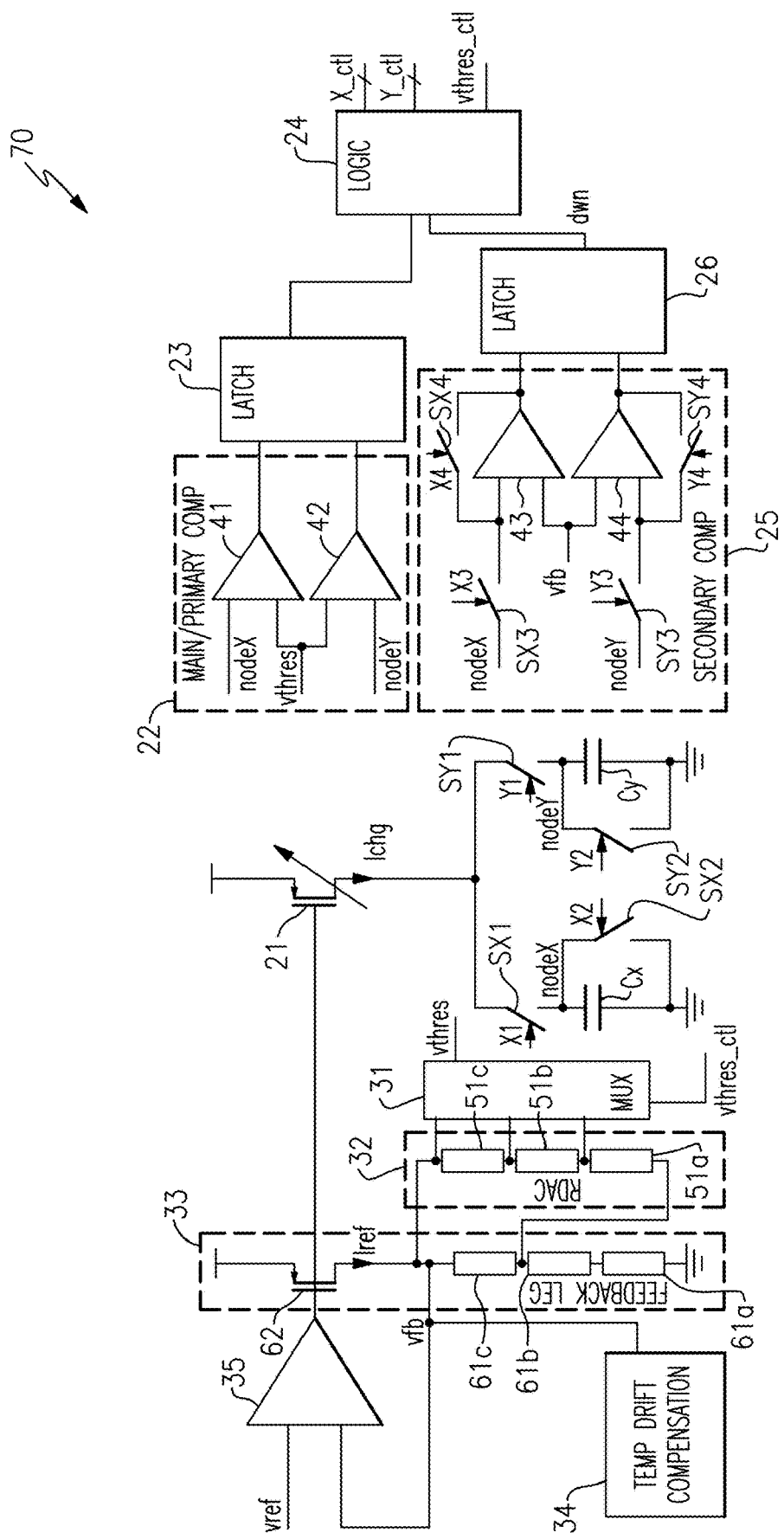
FIG. 2A is a schematic diagram of a relaxation oscillator according to another embodiment.

FIG. 2A is a schematic diagram of a relaxation oscillator 70 according to another embodiment. The relaxation oscillator 70 includes a controllable transistor current source 21, a first charging control switch SX1 (controlled by switch control signal X1), a second charging control switch SY1 (controlled by switch control signal Y1), a first capacitor Cx, a second capacitor Cy, a first reset control switch SX2 (controlled by switch control signal X2), a second reset control switch SY2 (controlled by switch control signal Y2), main or primary comparator circuitry 22, primary latches 23, digital logic circuitry 24, secondary latches 26, a threshold voltage multiplexer 31, a resistor ladder 32, feedback circuitry 33, temperature drift compensation circuitry 34, and a feedback amplifier 35.

Although another embodiment of a relaxation oscillator is shown in FIG. 2A, the teachings herein are applicable to relaxation oscillators implemented in a wide variety of ways. Accordingly, other implementations are possible.

As shown in FIG. 2A, the controllable transistor current source 21 generates a charging current (Ichg) used to charge the capacitor Cx when the first charging control switch SX1 is closed and to charge the capacitor Cy when the second charging control switch SY1 is closed. In certain implementations, the controllable transistor current source 21 is implemented as an array of selectable transistors to provide coarse controllability to the value of the charging current (Ichg). Additionally, the feedback amplifier 35 controls the gate voltage of the controllable transistor current source 21 to provide fine adjustment to the charging current (Ichg).

In the illustrated embodiment, the primary comparator circuitry 22 includes a first primary comparator 41 and a second primary comparator 42. Additionally, the secondary comparator circuitry 25 includes a first secondary comparator 43, and a second secondary comparator 44. In certain implementations herein, delay compensation circuitry includes a copy of the main comparators used to compare the voltage of the capacitor(s) after charging to the reference/target voltage.

With continuing reference to FIG. 2A, the secondary comparator circuitry 25 also includes a first sampling switch SX3 (controlled by switch control signal X3), a second sampling switch SY3 (controlled by switch control signal Y3), a first feedback switch SX4 (controlled by switch control signal X4), and a second feedback switch SY4 (controlled by switch control signal Y4). In certain implementations herein, delay compensation circuitry includes switches to enable tracking, sampling and reset phases.

The output of the secondary comparator circuitry 25 provides a first output signal and a second output signal indicating if the voltage of the capacitor Cx and the capacitor Cy, respectively, at the end of the charging phase was higher or lower than the vfb (or vref, for instance, due to feedback). The first and second output signals are latched by the secondary latches 26 to generate a latched signal (dwn), which indicates if either capacitor voltage exceeds vfb, in this embodiment. The latched signal (dwn) is processed by the digital logic circuitry 24 to generate a threshold control signal (vthres_ctl) used to control selection of the threshold voltage multiplexer 31.

In certain implementations, the digital logic circuitry 24 includes an up/down counter for processing the latched signal (dwn) to generate the threshold control signal (vthres_ctl). The digital logic circuitry 24 also generates first capacitor control signals (X_ctl) and second capacitor control signals (Y_ctl). X_ctl can include, for example, switch control signals X1, X2, X3, and X4. Y_ctl can include, for example, switch control signals Y1, Y2, Y3, and Y4.

In the illustrated embodiment, the threshold control signal (vthres_ctl) controls the multiplexer 31 to output the threshold voltage (vthres) with a desired voltage level. The threshold voltage (vthres) is used by the main comparator circuitry 22. In particular, the first primary comparator 41 compares the voltage across the capacitor Cx (the voltage of nodeX) to the threshold voltage (vthresh), while the second primary comparator 42 compares the threshold voltage (vthresh) to the voltage across the capacitor Cy (the voltage of nodeY).

The inputs to the multiplexer 31 are generated by the resistor ladder 32, in this embodiment. The resistor ladder 32 includes resistors 51a, 51b, and 51c, in this example. However, more or fewer resistors can be included.

As shown in FIG. 2A, the feedback circuitry 33 includes feedback resistors 61a, 61b, and 61c, and a feedback transistor 62, in this embodiment. However, other implementations are possible. The feedback circuitry 33 generates a feedback voltage (vfb) that is provided to the feedback amplifier 35 for comparison to a reference voltage (vref). The feedback voltage (vfb) is adjusted by the temperature drift compensation circuitry 34 to enhance performance over changes in temperature. The feedback amplifier 35 in turn controls transistor gate voltages to adjust the value of the reference current Iref through the feedback circuitry 33 and the charging current Ichg from the controllable transistor current source 21. However, other implementations are possible.

As shown in FIG. 2A, the primary loop and the secondary loop are cross-coupled. For example, the secondary loop is used to regulate a voltage reference of the primary loop. The resolution of the secondary loop is determined by mainly the amount of trimming bits controlling the threshold voltage (vthres).

In this embodiment, the threshold voltage (vthres) is generated by coupling the resistor ladder 32 between two points of the feedback resistors of feedback circuitry 33. In another implementation, the resistor ladder 32 is coupled between a copied or replica leg of the feedback circuitry 33.

With continuing reference to FIG. 2A, the resistor ladder 32 provides the multiplexer 31 with various available threshold voltage levels for selection. One or both points of where the resistor ladder 32 is connected can be selected to enhance the insensitivity of the resolution to process. For instance, one way is to couple its setting to the trimming of the main branch of the resistor ladder or stack.

One example of timing control at steady state for a half circuit (corresponding to capacitor Cx/nodeX) is now provided. Although one example of timing is described, other implementations are possible.

At t=0, switch SX2 is opened (using control signal X2) with switch SX1 closed (using control signal X1), thereby enabling charging of the capacitor Cx and causing the voltage on nodeX to rise. Additionally, at time t=t1, the voltage of nodeX crosses the threshold voltage (vthres), and at time t=t1+d switch SX1 is opened (using control signal X1). Additionally, at time t=t2>t1+d, switch SX4 is opened (using control signal X4), and at time t=t3, switch SX3 is closed (using control signal X3). Thus, the voltage of nodeX is getting compared to vfb or vref.

With continuing reference to FIG. 2A, at time t=t4, the output of the secondary comparator circuitry 25 is latched to generate the latched output signal (dwn). Additionally, at time t=t5, switch SX3 is opened. Furthermore, at time t=t6, switch SX2 is closed, thereby resetting the voltage of nodeX (for instance, to 0 V). Additionally, at time t=t7, switch SX1 and switch SX4 are closed.

Figure 2B:
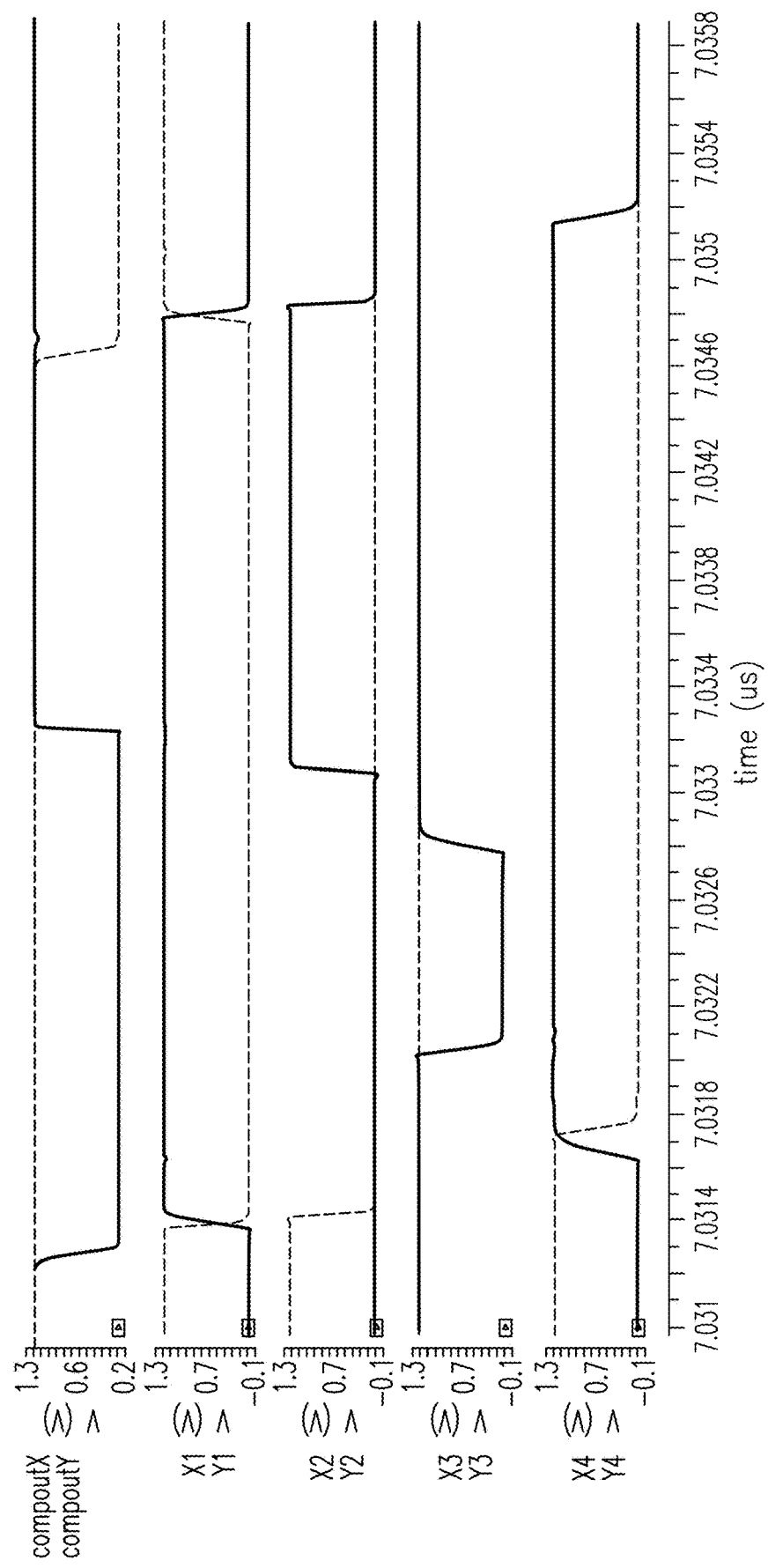
FIG. 2B is one example of a timing diagram for the relaxation oscillator of FIG. 2A.

FIG. 2B is one example of a timing diagram for the relaxation oscillator of FIG. 2A. The timing diagram includes plots for the output of the first primary comparator 41 (compoutX), the output of the second primary comparator 42 (compoutY), and for various switch control signals (X1, Y1, X2, Y2, X3, Y3, X3, Y4).

Although one example timing diagram is depicted, other implementations are possible.

Figure 3:
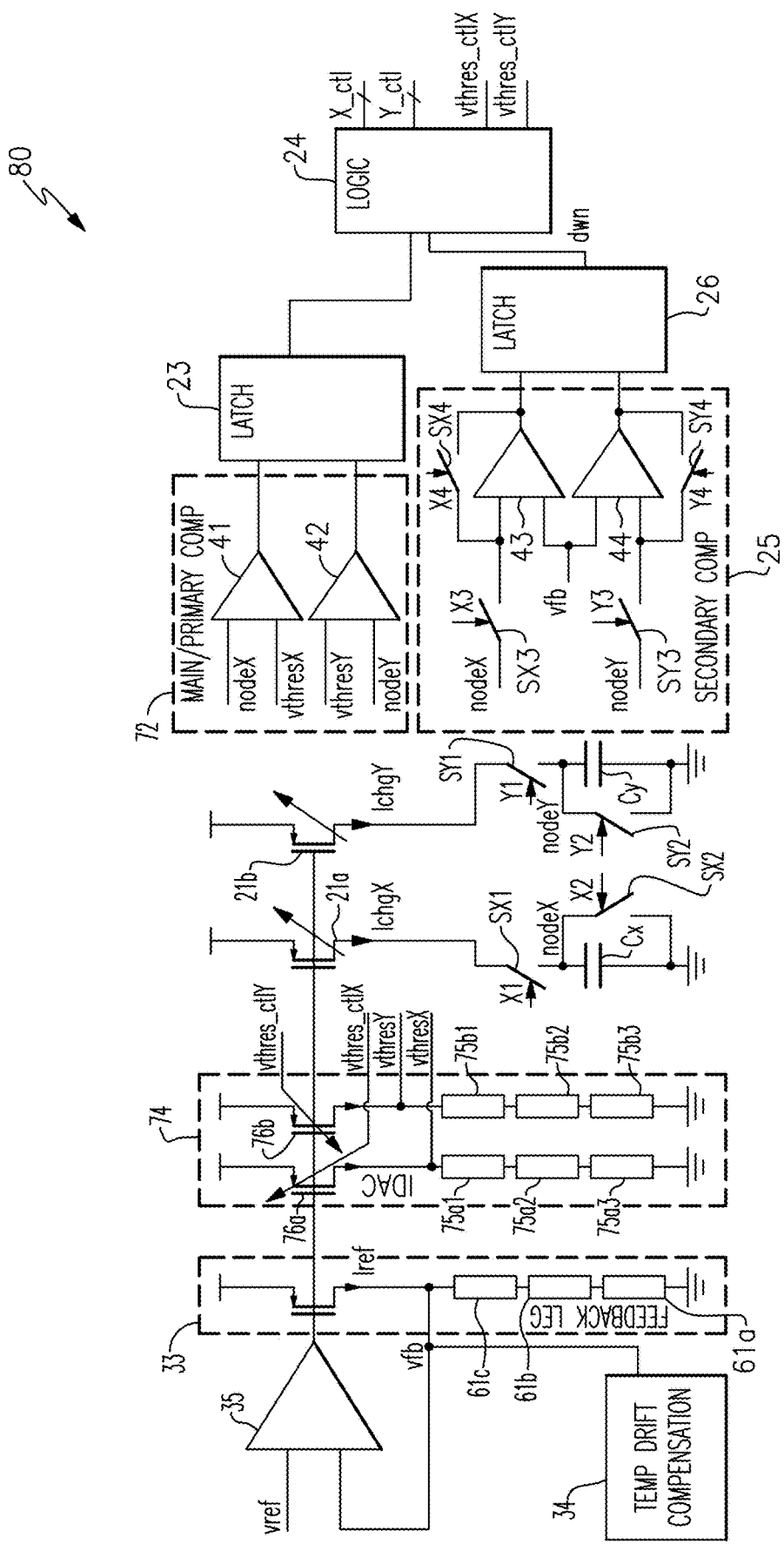
FIG. 3 is a schematic diagram of a relaxation oscillator according to another embodiment.

FIG. 3 is a schematic diagram of a relaxation oscillator 80 according to another embodiment. The relaxation oscillator 80 includes a first controllable transistor current source 21a, a second controllable transistor current source 21b, a first charging control switch SX1 (controlled by switch control signal X1), a second charging control switch SY1 (controlled by switch control signal Y1), a first capacitor Cx, a second capacitor Cy, a first reset control switch SX2 (controlled by switch control signal X2), a second reset control switch SY2 (controlled by switch control signal Y2), primary comparator circuitry 72, primary latches 23, digital logic circuitry 24, secondary latches 26, feedback circuitry 33, digital-to-analog converter (DAC) 74, temperature drift compensation circuitry 34, and a feedback amplifier 35.

The relaxation oscillator 80 of FIG. 3 is similar to the relaxation oscillator 70 of FIG. 2A, except that the relaxation oscillator 80 operates with multiple thresholds for comparison.

For example, as shown in FIG. 3, the first primary comparator 41 operates with a first threshold voltage (vthresX), while the second primary comparator 42 operates with a second threshold voltage (vthresY). Additionally, the DAC 74 includes a first controllable transistor current source 76a, a first group of resistors 75a1-75a3 (three, in this example), a second controllable transistor current source 76b, and a second group of resistors 75b1-75b3 (three, in this example). The first threshold control signal vthres_ctlX controls a first controllable transistor current source 76a to adjust the first threshold voltage (vthresX), while the second threshold control signal vthresh_ctlY) controls a second controllable transistor current source 76b to adjust the second threshold voltages (vthresY).

Furthermore, in this embodiment, multiple current sources are included, for instance, the first controllable transistor current source 21a for generating a first charging current (IchgX) for charging the first capacitor Cx, and the second controllable transistor current source 21b for generating a second charging current (IchgY) for charging the second capacitor Cy.

The teachings herein are applicable to relaxation oscillators implemented in a wide variety of ways.

In a first example, two or more capacitors are included each with a dedicated current source for charging.

In a second example, a reference voltage of the main loop can be taken at vref instead of vfb or a copy of it.

In a third example, the threshold voltage (vthres) is generated on a different leg that that of the feedback circuitry.

In a fourth example, multiple capacitors are included, with different threshold voltages for comparing the charging voltage of each capacitor. For instance, different threshold voltages can be provided for nodeX and nodeY.

In a fifth example, a DAC generates one or more threshold voltages derived from the current-to-voltage circuitry having its current dumped into a resistor ladder being a copy of the current-to-voltage feedback resistor. For instance, the DAC setting can determine the threshold voltage (vthres) value, for instance, by having the DAC controlled by an up/down counter from digital logic circuitry (similar to what is done with the resistor ladder/multiplexer of FIG. 2A).

In certain implementations herein, a fully digitized feedback loop (secondary loop) is used for delay compensation. The feedback can serve to provide automatic regulation/control of the threshold voltage of the main comparators (primary loop) such that the effective voltage at the capacitor at the end of the charging phase is the desired/targeted voltage. The digitization of the secondary feedback loop facilitates design ease, thereby providing simpler and/or smaller analog circuits. Moreover, such feedback loops are scalable with technology and/or facilitate providing a programmable frequency over a wide frequency tuning range with substantially constant performance.

Furthermore, the secondary loop can be used to change the reference voltage of the primary loop. Thus, the primary loop and the secondary loop are cross-coupled. In certain implementations, the secondary loop compares the voltage on the capacitor at the end of the charging phase with the targeted reference voltage (or a copy thereof). Additionally, the result of the comparison (second loop) is used to change the threshold voltage of the main comparators (main loop).

The threshold voltage can be generated in a wide variety of ways, including, but not limited to, using a DAC and/or using a resistor ladder connected to a buffered variant of vref or a supply.

Furthermore, dual secondary loops can be provide to independently control the voltages on each capacitor in implementations with two capacitors. Furthermore, each capacitor can be charged by an independent associated current source.

FIGS. 4A-4D are examples of electronic systems that can include a relaxation oscillator with delay compensation in accordance with the teachings herein. Such electronic systems are impacted by the accuracy and/or precision of the clock signal used to control timing, and thus reducing or eliminating error arising from delay of the relaxation oscillator's control circuitry can improve system performance. Although various examples of electronic systems are described below, relaxation oscillators with delay compensation can be used to control timing of a wide variety of downstream circuits.

FIG. 4A is a schematic diagram of one embodiment of a frequency synthesis system 410. The frequency synthesis system 410 includes a clock buffer 400, a relaxation oscillator 401, a divider 402 (divide by integer R, in this example), and a frequency synthesizer 403. The relaxation oscillator 401 is implemented in accordance with one or more of the features described herein.

In the illustrated embodiment, the relaxation oscillator 401 serves to control a frequency of a reference clock signal to the frequency synthesizer 403. Including the relaxation oscillator 401 aids in providing a reference signal for a wide range of operating parameters and/or usage scenarios.

FIG. 4B is a schematic diagram of one embodiment of a digital-to-analog data conversion system 420. The digital-to-analog data conversion system 420 includes a DAC 413 and a clock generation circuit 411 including a relaxation oscillator 401. The DAC 413 receives a digital input signal $D_{IN}$ and generates an analog output signal OUT. Additionally, the timing of conversion operations of the DAC 413 is controlled by the output clock signal $CLK_{OUT}$ from the clock generation circuit 411. The clock generation circuit 411 includes the relaxation oscillator 401, which is implemented in accordance with one or more features herein.

FIG. 4C is a schematic diagram of one embodiment of an analog-to-digital data conversion system 430. The analog-to-digital data conversion system 430 includes an ADC 423 and a clock generation circuit 411 including a relaxation oscillator 401. The ADC 423 receives an analog input signal IN and generates a digital output signal $D_{OUT}$. The timing of conversion operations of the ADC 423 is controlled by the output clock signal $CLK_{OUT}$ from the clock generation circuit 411.

FIG. 4D is a schematic diagram of one embodiment of a radio frequency front-end system 440. The radio frequency front-end system 440 includes an upconverting mixer 431, a power amplifier (PA) 433, a downconverting mixer 432, a low noise amplifier (LNA) 434, an antenna access component 435 (for instance, a switch, duplexer, and/or circulator), an antenna 436, and a local oscillator 421 including a relaxation oscillator 401.

As shown in FIG. 4D, the relaxation oscillator 401 is included in the local oscillator 421 to aid in generating clock signals for frequency upconversion and frequency downconversion operations. In certain implementations, a polyphase filter or other suitable quadrature clock generation circuitry are included in the local oscillator 421 to generate a pair of clock signals having a quadrature phase relationship such that transmit and/or receive paths operate using quadrature signaling.

Figure 5:
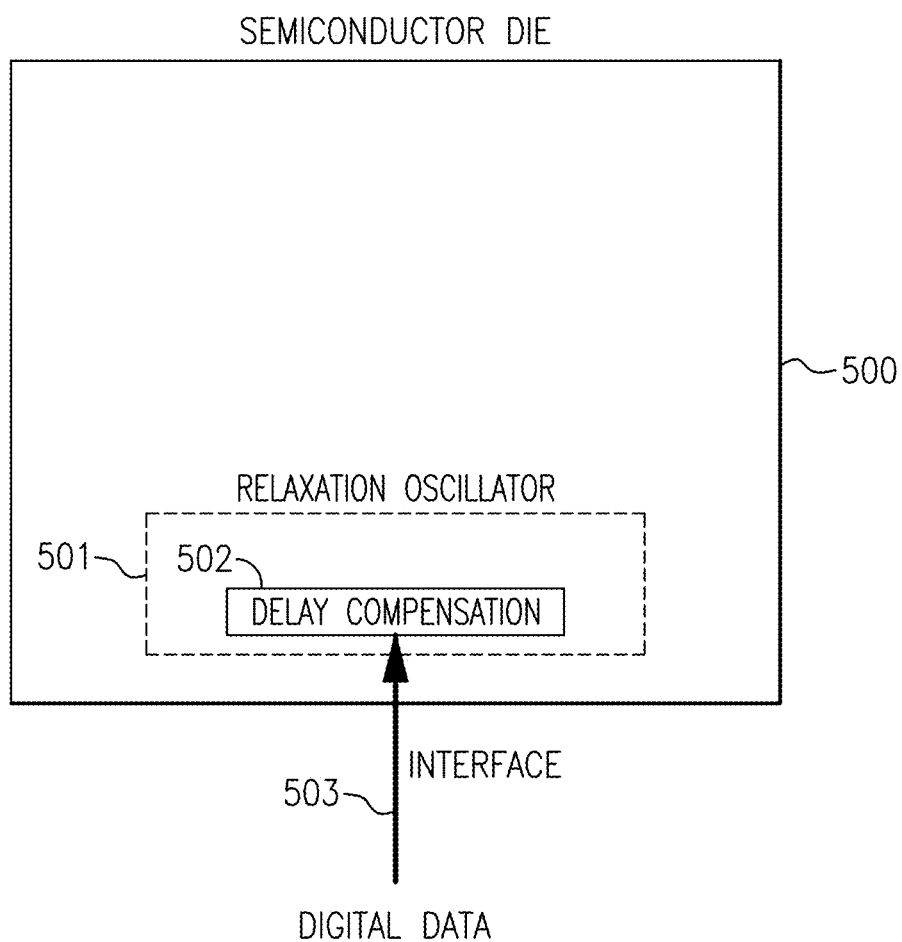
FIG. 5 is a schematic diagram of one embodiment of a semiconductor die including a relaxation oscillator.

FIG. 5 is a schematic diagram of one embodiment of a semiconductor die 500 including a relaxation oscillator 501. The relaxation oscillator 501 includes a delay compensation circuit 502 implemented in accordance with the teachings herein.

In the illustrated embodiment, the semiconductor die 500 includes a chip interface 503 (for instance, a serial interface or bus) for receiving digital data for programming the relaxation oscillator 501 and/or the delay compensation circuit 502. For example, the digital data received from the interface 503 can be used to not only program the relaxation oscillator 501 with a desired period or frequency, but also to program the bandwidth of the delay compensation circuit 502, the duty cycle of the delay compensation circuit 502, and/or other delay compensation characteristics. Moreover, in certain implementations, the characteristics of the delay compensation circuit 502 can have values that are separately programmed for start-up relative to steady-state operation, thereby providing further enhancements in flexibility and performance.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A relaxation oscillator with delay compensation, the relaxation oscillator comprising:
    a first capacitor;
    a first current source configured to output a first charging current, wherein the first current source is regulated by a feedback loop;
    control circuitry that operates to selectively charge the first capacitor with the first charging current, the control circuitry including a first primary comparator configured to compare a charging voltage of the first capacitor to a threshold voltage, wherein the threshold voltage is generated based on a feedback voltage of the feedback loop; and
    delay compensation circuitry electrically coupled to the first capacitor and operable to adjust the threshold voltage to provide compensation for a delay of the control circuitry.

2. The relaxation oscillator of claim 1, further comprising a multiplexer configured to receive a plurality of available threshold voltages, and to output a particular one of the available threshold voltages as the threshold voltage, wherein the delay compensation circuitry controls the multiplexer.

3. The relaxation oscillator of claim 2, wherein the plurality of available threshold voltages are generated based on the feedback voltage of the feedback loop.

4. The relaxation oscillator of claim 3, further comprising a plurality of resistors in series between the feedback voltage and a ground voltage and operable to generate the plurality of available threshold voltages.

5. The relaxation oscillator of claim 1, further comprising a second capacitor, wherein the control circuitry further includes a second primary comparator configured to receive a charging voltage of the second capacitor.

6. The relaxation oscillator of claim 5, wherein the first primary comparator and the second primary comparator both use the threshold voltage for comparisons.

7. The relaxation oscillator of claim 5, wherein the first primary comparator and the second primary comparator use different threshold voltages for comparisons.

8. The relaxation oscillator of claim 7, wherein the delay compensation circuit is operable to separately control the voltage levels of the different threshold voltages.

9. The relaxation oscillator of claim 5, wherein the delay compensation circuitry includes a first secondary comparator configured to receive the charging voltage of the first capacitor, and a second secondary comparator configured to receive the charging voltage of the second capacitor.

10. The relaxation oscillator of claim 9, wherein the first secondary comparator and the second secondary comparator use the feedback voltage of the feedback loop for comparisons.

11. The relaxation oscillator of claim 1, further comprising a reset switch controlled by the control circuitry and operable to reset the charging voltage.

12. The relaxation oscillator of claim 1, further comprising a second capacitor and a second current source configured to generate a second charging current, wherein the control circuitry operates to selectively charge the second capacitor with the second charging current.

13. The relaxation oscillator of claim 1, further comprising a current control switch electrically connected in series with the first current source and the first capacitor and controlled by the control circuitry.

14. The relaxation oscillator of claim 1, wherein a bandwidth and a duty cycle of the delay compensation circuitry are programmable.

15. A method of delay compensation in a relaxation oscillator, the method comprising:
    outputting a charging current from a current source;
    regulating the current source using a feedback loop;
    selectively charging a capacitor with the charging current to control a period of the relaxation oscillator using control circuitry;
    comparing a charging voltage of the capacitor to a threshold voltage using a primary comparator of the control circuitry;
    generating the threshold voltage based on a feedback voltage of the feedback loop; and
    adjusting the threshold voltage to provide compensation for a delay of the control circuitry.

16. The method of claim 15, wherein adjusting the threshold voltage to provide compensation includes providing the charging voltage to a secondary comparator.

17. The method of claim 15, wherein adjusting the threshold voltage to provide compensation includes using a multiplexer to select one of a plurality of available threshold voltages as the threshold voltage.

18. The method of claim 17, further comprising generating the plurality of available threshold voltages based on the feedback voltage of the feedback loop.

19. The method of claim 18, further comprising generating the plurality of available threshold voltages using a plurality of resistors in series between the feedback voltage and a ground voltage.

20. A method of delay compensation in a relaxation oscillator, the method comprising:
    outputting a charging current from a current source;
    selectively charging a capacitor with the charging current to control a period of the relaxation oscillator using control circuitry;
    comparing a charging voltage of the capacitor to a threshold voltage using a primary comparator of the control circuitry;
    adjusting the threshold voltage to provide compensation for a delay of the control circuitry, including providing the charging voltage to a secondary comparator; and
    regulating the charging current using a feedback loop, and using the secondary comparator to compare a feedback voltage of the feedback loop to the charging voltage.

\* \* \* \* \*